United States Patent [19]

Orvek et al.

[11] Patent Number: 4,770,739
[45] Date of Patent: Sep. 13, 1988

[54] BILAYER PHOTORESIST PROCESS

[75] Inventors: Kevin J. Orvek; Cesar M. Garza, both of Plano, Tex.

[73] Assignee: Texas Instruments Incorporated, Dallas, Tex.

[21] Appl. No.: 10,378

[22] Filed: Feb. 3, 1987

[51] Int. Cl.[4] .......... B44C 1/22; C03C 15/00; C03C 25/06; C23F 1/02
[52] U.S. Cl. .......... 156/643; 156/646; 156/652; 156/655; 156/656; 156/661.1; 156/668; 156/904; 427/43.1; 430/312; 430/313; 430/318
[58] Field of Search .......... 430/312, 313, 315, 318; 156/643, 646, 652, 655, 656, 659.1, 661.1, 668; 427/43.1; 204/192.32, 192.35

[56] References Cited

U.S. PATENT DOCUMENTS 4,557,797 12/1985 Fuller et al. .......... 156/643
4,657,629 4/1987 Bigelow .......... 156/643
4,670,090 6/1987 Sheng et al. .......... 156/653

Primary Examiner—William A. Powell
Attorney, Agent, or Firm—Rodney M. Anderson; Leo N. Heiting; Melvin Sharp

[57] ABSTRACT

The present invention relates to a bilayer photoresist process, wherein a first planarizing resist layer is applied to a base and a second or top photoresist layer is applied over the first. The top layer resist is sensitive to deep UV light, while the planarizing layer resist is sensitive to near UV or violet light. The top layer, by use of a dye or other means, is opaque to predetermined near UV or violet wavelengths by which the planarizing layer is illuminated. The top layer is patterned using deep UV light. A flood exposure of the predetermined near UV or violet wavelengths is then used to transfer the pattern of the top layer to the bottom planarizing resist layer. Improved resolution is achieved by the use of deep UV light for patterning the top layer. Less costly yet faster illumination of the planarizing layer is accomplished by using near UV or violet light. Additionally pattern degradation due to spurious reflections normally occurring from near UV exposure of the top layer is avoided. Also, the near UV sensitive resist planarizing layer results in a better dry etch mask than previous bilayer scheme planarizing layers.

The pattern of the resolution layer can be transferred to the planarization layer by plasma etching.

33 Claims, 1 Drawing Sheet

BILAYER PHOTORESIST PROCESS

TECHNICAL FIELD

The present invention relates to the fabrication of integrated circuit devices. In particular, the present invention relates to photoresist patterning techniques in the fabrication of integrated circuit devices.

BACKGROUND OF THE INVENTION

The conventional methods of patterning integrated circuit structures use a photoresist, i.e., a polymeric composition sensitive to certain radiant energy such that a developer solvent will selectively remove only those portions of the photoresist which have been exposed (or for different compositions, selectively only those portions which are unexposed). After removal of portions of the photoresist, a patterned photoresist layer is left in place on a substrate which provides a patterned mask for subsequent steps such as ion implantation, etching, or patterned deposition of materials by lift off techniques (i.e., depositing a material over all and then removing the remaining portions of photoresist to leave the material only where the photoresist was not present).

Significant problems in a lack of conformal coating of the pattern of the reticle through the resist onto the substrate have been encountered in patterning methods, particularly where patterning is attempted in upper layers of circuit structures where patterns of lower levels provide substantial topography. These problems are due in part to the unequal thickness of resist materials over the topography of the lower levels. Problems also arise from reflections from lower layer structures during exposure of resist materials above the structures. In such cases multilayer resist processes have been proposed.

Conventional bilayer resist processes use a thin resolution top layer resist sensitive to the near UV or violet spectrum on top of a thick planarizing layer of deep UV sensitive resist. Standard lithographic processes are used to pattern the top layer with near UV or violet light. The pattern is transferred into the bottom layer using a flood (i.e. not patterned) exposure with deep UV light, usually in the spectral region of 200 to 260 nanometers, followed by a develop step. Most frequently used conventional optical imaging systems operate in the range of from 365 nanometers on up through about 450 nanometers for patterning the resolution layer. However, conventional multilayer resist processes are subject to problems including limited resolution capability, difficulty of process, unreliability, susceptibility to reflection effects, and relative costliness of light sources for exposure.

An example of a conventional bilayer method is shown in B. J. Lin, SPIE vol. 174, "Developments in Semiconductor Microlithography IV" (1979), incorporated herein by reference. Described therein is a bilayer resist method in which a relatively thick planarization layer of photoresist sensitive to deep UV light is first disposed over a partially fabricated semiconductor structure. A second relatively thin layer of near UV sensitive photoresist is spun onto the planarization layer. The resist on top is chosen to be opaque for deep UV light. The top photo resist is delineated with patterned exposure by near UV light. The patterned top layer then serves as a mask for exposure of the planarization layer photoresist which can be delineated with a blanket deep UV exposure.

It has also been proposed to use a combination of deep UV sensitive photoresists for both the planarization layer and top layer in bilayer photoresist schemes. See, A. W. McCullogh, E. Pavelchek, and H. Windischmann in *J. Vac. Sci. Techno.*, B4(4) Oct.-Dec. 1983, pp. 1241-1246, as well as E. Ong. R. M. Baker, and L. P. Hale in *J. Vac. Sci. Technol.*, B1(4), Oct.-Dec. 1983, pp. 1247-1250, and also B. J. Lin, E. Bassous, V. W. Chao, and K. E. Petrillo in *J. Vac. Sci. Technol.*, 19(4), Nov./Dec. 1981 at pages 1313 to 1319, each incorporated herein by reference, each describing bilayer schemes wherein a deep UV resist is used as a resolution layer on top of another deep UV resist used as a planarization layer. Both layers are exposed with deep UV light with the planarization layer exposed at the same or a deeper wavelength than the resolution layer.

As pointed out above, reflections from structures below the resist material present problems in photoresist patterning. If reflections from substructures occur during a patterned exposure of a resist layer, it frequently occurs that the reflections spread radiant energy through the resist outside the pattern for which exposure is desired. Consequently, portions of resist are exposed (by light reflected from substructures) which are not intended to be exposed. During development these inadvertently exposed portions are developed along with the intended portions resulting in an inaccurate transfer of the intended pattern.

In an attempt to reduce problems arising from reflections from structures below the resist layers in bilayer resist schemes, it has been proposed to add a dye to the planarization layer photoresist. See, K. Bartlett and G. Hillis in SPIE Vol. 394, pages 49-56, Mar. 16-17, 1983, incorporated herein by reference, wherein a dye, Coumarin 6 is mixed into the PMMA resist (sensitive to deep UV light) used as the lower resist layer before the lower layer resist is deposited on the semiconductor structure. Kodak 809, a photoresist sensitive to near UV light, is used as the top layer resist. Coumarin 6 strongly absorbs near UV light of the wavelength used to expose the Kodak 809 photoresist of the top layer. Consequently, during the patterned exposure of the Kodak 809 resist, light passing down into the PMMA resist layer is absorbed by the Coumarin 6 before reflecting back up to the Kodak 809 layer and inadvertently exposing unintended portions of that layer. Problems from reflections from substructures are, accordingly, reduced.

Dyes are also used to reduce reflections in single layer resist processes. See, M. Bolson, G. Buhr, H. J. Merrem, and K. van Werden in Solid State Technology, February 1986 at pages 83-88, wherein it is disclosed to add dyes to resists in single layer photoresist processes to minimize reflections from lower layer structures.

However, the previously proposed resist schemes are subject to certain limitations. The near UV exposure required for patterning the resolution layer in some schemes does not provide as high a pattern resolution as is often desired. Moreover, all the previously proposed schemes expose the planarization layer resist using deep UV light. Conventional sources of such deep UV light are relatively costly and provide a relatively low power output in comparison with conventional near UV light sources. The previous systems also are susceptible to aberrational patterning from reflection effects or complications in the processes to attempt to reduce those effects. Accordingly, a need exists for photoresist patterning providing high resolution over severe topographies, improved reflection control and which has inexpensive yet faster photoresist illumination.

SUMMARY OF THE INVENTION

In accordance with the present invention, a novel bilayer resist process and product is disclosed which reduces or eliminates disadvantages and shortcomings associated with prior methods and which provides additional advantages as well.

According to the present invention, a method of patterning photoresist on a body having semiconducting surface areas and a product so produced is provided. A first photoresist material, sensitive to near UV or violet light, is deposited over the top surface of the body to provide a substantially planar surface over the body. A second photoresist material, sensitive to deep UV light, is deposited over the substantially planar surface of the first photoresist material. The second photoresist material is opaque, or capable of being rendered opaque, to a predetermined near UV or violet light for illuminating the first photoresist. The second photoresist material is exposed to patterned illumination of deep UV light and then developed removing areas determined by the patterned exposure. The first photoresist material is illuminated by a flood or blanket (i.e. unpatterned) exposure of light of the predetermined near UV or violet wavelength. Finally, the first photoresist material is developed.

The present invention can be used in all applications of photoresist patterning known in the art including selective etching processes, selective lift-off deposition processes, selective ion implantation processes or metalization processes or other processes known to the art.

BRIEF DESCRIPTION OF THE DRAWINGS

The present invention will be described with reference to the accompanying drawings, wherein.

DESCRIPTION OF THE PREFERRED EMBODIMENTS

Figure 1:
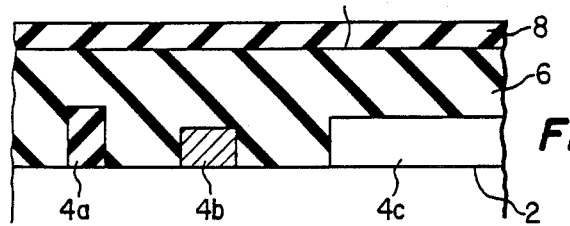
FIG. 1 shows a cross sectional side view of a base having semiconducting surface areas and first and second photoresist layers in accordance with the present invention.

FIG. 1 shows a cross-sectional side view of an embodiment illustrating the present invention. A body 2 of an integrated circuit structure is provided having disposed thereon device structures 4a-4c which give the body a varying topography. The device structures 4a-4c may comprise any semiconductor device structures including, for example, metal, polysilicon or oxide composition. For purposes of illustration, structure 4a is depicted as composed of silicon dioxide, 4b is depicted as composed of aluminium and 4c is depicted as composed of polysilicon. Deposited over the topography on top of body 2 is a layer of a first photoresist material 6 which has been deposited to provide a substantially planar surface 7. Deposited on top of the first photoresist material 6 is a layer of the second photoresist material 8. The respective resist layers are deposited by procedures used in conventional bilayer resist processes, taking into account the characteristics of the specific resists being used. The first photoresist material 6 is sensitive to light in the near UV or violet range. The second photoresist material 8 is sensitive to light in the deep UV range. The second photoresist material 8 is opaque or includes therein a dye or other opaquing agent which renders the second photoresist material opaque to light of a predetermined wavelength in the near UV or violet range. An example of such a dye is Coumarin 6 dye.

The second photoresist layer is exposed to patterned illumination of deep UV light and then developed. Since the second photoresist is opaque or rendered opaque to a predetermined near UV or violet light, the pattern defined in the second layer can be transferred to the planarization layer by a flood or blanket (i.e. unpatterned) exposure of light of the predetermined near UV or violet light.

It should be noted that the selection of resist for the first and second resist materials is essentially opposite that of conventional practice. In conventional bilayer practice, the resist used for the planarizing first layer of photoresist material is sensitive to deep UV light while the second or resolution layer of photoresist material is sensitive to near UV light. In the present invention, a deep UV sensitive photoresist is used as a top or resolution layer and a near UV or violet sensitive photoresist is used as the bottom planarization photoresist layer. Also a dye or other opaquing agent is added to the top resolution layer photoresist to block light of a predetermined wavelength during illumination of the planarization layer photoresist.

Figure 2:
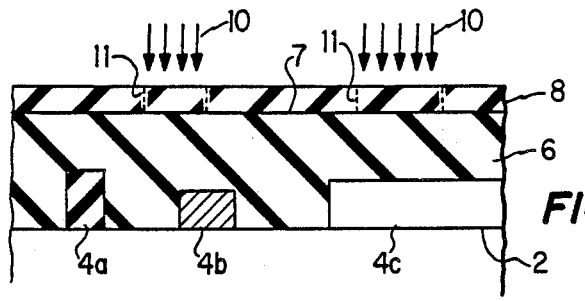
FIG. 2 is a cross sectional side view of the embodiment shown in FIG. 1 also showing a step of patterning the second photoresist layer.

FIG. 2 shows the embodiment of FIG. 1 illustrating the step of patterning the resolution layer photoresist. Light of the deep UV wavelength is shown impacting on the resolution layer 8 in a predetermined pattern. Such predetermined pattern can be provided by passing collimated deep UV light through a reticle or by other means known in the art. The deep UV light is provided for a sufficient period of time and in sufficient intensity to expose the depth of the resolution layer photoresist in the predetermined pattern.

Figure 3:
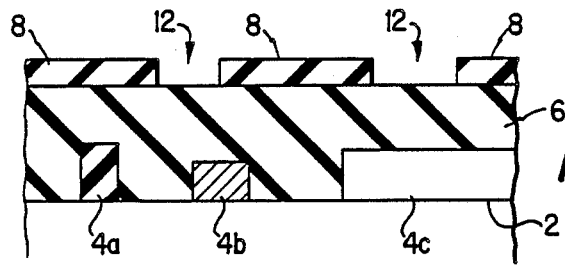
FIG. 3 is a cross sectional side view of the embodiment shown in FIG. 1 showing the embodiment after development of the second photoresist layer.

FIG. 3 shows the embodiment of FIG. 1 after the step of development of the resolution layer has occurred. Spaces 12 are shown representing areas exposed to deep ultraviolet light in the step shown in FIG. 2. The photoresist of these areas has been removed during the development process. An alternative process could also be used wherein the unexposed, rather than exposed, areas of photoresist in the resolution layer are removed during development, if desired.

Figure 4:
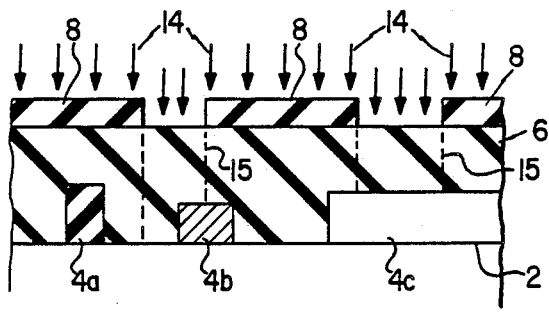
FIG. 4 is a cross sectional side view of the embodiment of FIG. 1 showing the step of illuminating the first photoresist.

FIG. 4 shows the embodiment of FIG. 1 illustrating the step of illumination of the planarization layer photoresist. This is accomplished by a blanket or flood (i.e. unpatterned) exposure of near UV or violet light 14 of a predetermined wavelength over the surface of the material. Since the resolution layer photoresist is opaque or has been rendered opaque to light of the predetermined wavelength, light from the near UV or violet flood 14 does not penetrate the resolution layer to expose the planarization layer photoresist in those areas still covered by resolution layer photoresist. The pattern of the resolution layer is thus transferred to the planarization layer of photoresist exposing those portions 15 of the planarization photoresist receiving near UV or violet light 14.

Figure 5:
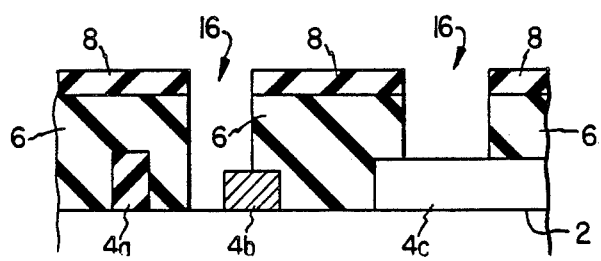
FIG. 5 is a cross-sectional side view of the embodiment shown in FIG. 1 showing the embodiment after development of the first photoresist layer.

FIG. 5 shows a cross-sectional side view of the embodiment of FIG. 1 after the step of developing the planarization layer photoresist. Spaces 16 represent those areas where exposed planarization layer resist has been removed during development of the planarization layer resist. After development of the planarization layer resist, known semi-conductor fabrication techniques are employed using the patterned resist on the body.

The following definitions are provided for clarity.

By "near UV light" is meant light having a wavelength of from approximately 310 nanometers to 395 nanometers.

By "violet light" is meant light of a wavelength of from approximately 395 to 455 to 490 nanometers.

By "deep ultraviolet light" is meant light having a wavelength of 185 nanometers or less to 310 nanometers. The definition herein for deep UV light has a short wavelength cut-off at 185 nanometers or less, but the wavelength of 185 nanometers is simply imposed by atmospheric absorption of wavelengths shorter than 185 nanometers. Shorter wavelengths would serve perfectly well to expose the second photoresist material, aside from the difficulty of transferring them through an atmosphere. For example, it is alternatively possible to use vacuum ultraviolet wavelengths, i.e. below 185 nanometers, for the exposure of the first photoresist. Consequently, the term "Deep UV" as used herein also includes light having wavelengths shorter than 185 nm.

The terms "resolution layer," "top layer" or "layer of second photoresist material" are used interchangeably and refer to the second layer of photoresist applied to the body in the process of the present invention. This layer of photoresist is the layer on which the predetermined pattern is set by exposure of deep UV light through a reticle or other means.

The terms "planarization layer," "bottom layer" or "layer of first photoresist material" are used interchangeably and refer to the first layer of photoresist material deposited on the base in accordance with the present invention. In applications involving severe topography on the base the planarization layer serves to provide a substantially planar surface upon which the resolution layer is deposited and patterned. The pattern of the resolution layer is then transferred into the planarization layer.

The present invention provides substantial improvement in resolution capability during patterning of the top or resolution photoresist layer. Light diffraction with a consequent lack of resolution inevitably occurs during patterning of the top layer as light passes through the reticle defining the pattern to the top layer. Shorter wavelength light is diffracted less than longer wavelength light when passing through the reticle. Accordingly, by patterning the top layer with deep UV rather than conventional near UV light, less diffraction occurs and improved pattern resolution is obtained in the top layer. The improved pattern is then transferred from the resolution layer to the planarization layer. Diffraction is a much less significant concern during illumination of the planarization layer since the pattern defining means is the developed top layer which is just on top of the planarization layer. Since the light travels only a short distance from the top layer to the planarization layer, diffraction from the top layer does not substantially affect the resolution of the planarization layer.

The present invention also provides increased efficiency and economy in a bilayer process. In most bilayer resist processes and in the present invention, the planarizing layer resist is relatively thick in comparison with the top layer. Accordingly, exposure of the planarizing layer resist usually takes more energy and time than exposure of the relatively thin top resist. The planarizing layer resist in the present invention is sensitive to near UV or violet light as compared to the prior processes which use a deep UV resist for the relatively thick planarizing layer. Since light sources for near UV or violet light are considerably less expensive than light sources for deep UV light, with the present invention the planarizing layer resist is exposed using a much more economical light source than with conventional processes. Moreover, conventional light sources have a greater power output at near UV wavelengths than at deep UV wavelengths, thus making possible shorter exposure times for exposing the planarizing layer resist than was previously possible.

Additionally, patterning aberrations arising from reflections from lower layer structures are reduced by the present invention. This is because the typical near UV sensitive resists used for the planarization layer (an example of which is Novolak) are inherently highly absorptive of the deep UV wavelengths used to pattern the resolution layer. Accordingly, during patterning of the resolution layer, deep UV light passing through the resolution layer is absorbed by the planarization layer resist and is relatively unlikely to reflect off substructures and return to the resolution layer inadvertently exposing unintended portions of the resolution layer. Thus patterning aberrations arising from lower layer structures are reduced.

Further, the present invention provides an improved dry etch resist mask than was provided by previous bilayer processes. The near UV sensitive resist used in the present invention as the planarization layer is a much better dry etch mask than is PMMA, the deep UV sensitive resist typically used as the planarizing layer resist in conventional bilayer processes.

The present invention has particular application in those situations where photoresist patterning is desired over severe topographies, but the invention also has application in instances without severe topography but where it is desired to push the resolution of the exposing equipment past the normal design capabilities of that equipment. This capacity arises because of the relatively thin dimension of the second photoresist layer in comparison with the thickness of a single resist layer used in conventional single resist processes. The relatively thin second resist layer can be patterned with a shorter exposure time than could the relatively thick single layer, thus providing less opportunity for decreased resolution due to diffraction of light during patterning.

The present invention can be used in all applications of photoresist patterning known in the art including selective etching processes, selective lift-off deposition processes, selective ion implantation processes, or metalization processes, or other processes known to the art.

The planarization layer may comprise any photoresist material as known in the art having a close sensitivity to light in the near UV or violet range. An example of a preferred planarization layer photoresist is Shipley 1818 resist. The first photoresist material should preferably be spin-coatable, preferrably to a thickness to a range of 1-5 microns thick, preferably to a thickness which is generally uniform across the slice and planarizes the topography at least to some extent. Second, the first photoresist material must be photosensitive to some wavelength to which the second photoresist material is opaque or rendered opaque. Third, it is preferable, although not necessary, that the first photoresist material should be able to provide etch resistance for plasma etching. As is well known in the plasma etching art, control of etching is much easier where resist erosion during the etch process is minimized. Fourth, it is preferable, although not necessary, that the first photoresist material be capable of development in a solvent which will not erode the top layer. This provides the advantage that a capped resist structure remains in place, so that the remaining portions of the second photoresist material will provide some further patterned resistance to subsequent processing steps such as plasma etching. Fifth, it is necessary that the first photoresist material not be eroded in some set of conditions which are capable of developing the second photoresist material. Sixth, it is preferable, although not necessary, that the first photoresist material strongly absorb deep UV light of the wavelength intended for exposure of the resolution layer.

The requirements and preferable elements of the second photoresist material are that it be uniformly coatable, preferably thinly, e.g. to a thickness of less than one micron, for best geometry and pattern sensitivity. Second, the photoresist material must be photosensitive to deep UV lights. Third, the second photoresist material must be developable. Fourth, the resist must be able to carry a dye or other opaquing agent to render the resolution layer opaque, or must otherwise be opaque or endered opaque, to the near UV or violet light used to illuminate the planarization layer resist. A fifth preferable element, which is not necessary, is that, to permit rework, it should be possible to selectively remove the second photoresist material without removing the first photoresist material. A sixth preferable element, which is not necessary, is that the resist not polymerize to an unsatisfactory degree during illumination of the planarization layer. An example of a preferred resolution layer photoresist is PMGI resist available from Shipley Corporation.

In the practice of the present invention, it is necessary that the resolution layer be opaque or rendered opaque to near UV or violet light of a wavelength selected for illuminating the planarization layer photoresist. This can be accomplished by premixing into the resolution layer photoresist a suitable dye or other opaquing agent or combination of dyes or agents prior to deposition of the resolution layer on the top surface of the planarization layer. An example of such a dye is Coumarin No. 6 dye. Alternatively, a suitable photoresist which of itself is opaque to the predetermined near UV or violet light could be used for the resolution layer photoresist. Additionally, a photoresist or opaquing agent which is rendered opaque to the predetermined wavelength by some event after deposition on the top surface of the planarization layer could be used. Additionally, a wash of a suitable dye or opaquing agent could be applied to the resolution layer after deposition on the planarization layer to provide the resolution layer with the desired opaquing characteristic.

Suitable light sources for the deep UV exposure include deep UV mercury, xenon-mercury, or deuterium lamps, or excimer laser or other sources. Light sources for the near UV or violet exposure can be any of the well known relatively inexpensive sources of such light, including white light from conventional incandescent light bulbs. The flood exposure on the planarization layer of the present invention thus requires equipment that is much less expensive than that currently required for the deep UV flood exposure of planarization layers in conventional bilayer processes. The light for the flood exposure need not be collimated, but it may be collimated to increase the resolution of the pattern transfer from the resolution layer to the planarization layer.

The planarization layer is preferably of a depth of 1.5 microns, or less preferably from 0.8 to 2.5, or less preferably from 0.4 to 5 microns although greater or lesser depths may be used as desired. The present invention may be used in instances where no topography is to be covered to instances where topographic structures of from 0.2 to 0.7 microns or more in height are found on the base. The resolution layer is most preferably about 0.5 microns thick but may also range from from 0.3 to 1.0 microns or less preferably from 0.2 or less to 1.5 microns.

In the practice of the present invention, exposure of the planarizing layer may be accomplished in as little as one second for an entire slice, as compared with one to five minutes for the flood exposure under conventional practice. Conventional flood exposures in the deep UV spectrum are usually carried out at approximately 15 milliwatts per centimeter squared, while flood exposure in the near UV or violet spectrum under the present invention could easily be accomplished at 900 milliwatts per centimeter squared.

Although it is preferable that the second resist be patterned by exposure to deep UV light, it is, alternatively, not necessary in every instance in the practice of the present invention that the second resist be exposed with deep UV light and the first resist exposed with near UV light. For example, both resists could be exposed at either deep UV or near UV wavelengths and still obtain several advantages of the present invention. The essential criteria in such instances for the practice of the present invention, apart from those as set out earlier herein, is that the second photoresist be exposed with radiant energy having a wavelength shorter than that at which the first photoresist is exposed, and also that the second photoresist be opaque or rendered opaque to the wavelength of light used to expose the first photoresist.

The present invention should extend the resolution of optical lithography down to the 0.5 micron or smaller region.

The following example shows an embodiment of and illustrates the present invention.

EXAMPLE 1

A semiconductor substrate is provided having semiconducting structures thereon of heights from 0.3 to 0.5 microns. A layer of Shipley 1818 photoresist is spun onto the substrate to a depth of 1.5 microns. The planarization photoresist provides a substantially planar surface over the semiconductor substrate. Coumerin No. 6 dye is added to Shipley PMGI photoresist and the combination is spun onto the top surface of the planarization layer to form a resolution layer 0.5 microns thick. The resolution layer is patterned using an optical stepper with a chrome reticle in collimated light of 248 nanometers provided by an excimer laser. The resolution layer is developed, removing those portions of the resolution layer photoresist exposed to the deep UV patterned light. A violet light flood is next provided by exposure to light provided by a white light incandescent bulb which has been collimated. The incandescent bulb emits virtually no light in the ultraviolet regions. The Coumarin 6 dye in the resolution layer absorbs most of the light impacting on those portions in the violet and blue spectrum. Use of cut-off filters in the incandescent light source can result in an improved match between the exposing wavelengths and the wavelength absorption region of the Coumarin 6 dye. The light reaching the planarization layer photoresist through the patterned areas of the resolution layer expose those areas of the planarization layer photoresist. Finally, the planarization layer photoresist is developed to remove the exposed portions of that photoresist.

The example provides an improved resolution in the patterning of the resolution layer photoresist due to reduced diffraction through the reticle by the use of deep UV light rather than near UV light. The flood exposure of the planarization layer photoresist is accomplished by the use of an inexpensive light source and the flood exposure is accomplished in a shorter period of time than heretofore accomplished since the light source has greater power output at near UV wavelengths than at deep UV wavelengths. Reduced notching or other reflection effects result during the patterning of the resolution layer due to the high absorption of the planarizing layer resist to the deep UV light. Additionally, the near UV or violet sensitive planarization layer photoresist provides a better dry etch mask than does UV sensitive PMMA used in conventional practice for the planarization layer photoresist.

The process as described herein is particularly useful for patterning the upper layers in an integrated circuit structure, especially the metal layers, but is also useful for patterning all other layers, gates, source drains, contacts, etc.

The present invention can be used in all applications of photoresist patterning known in the art, including selective etching processes, wherein after patterning of both layers of photoresist, the base or structure is exposed to a predetermined etchant, whereby portions of the top surface of the base exposed by the first resist layer are etched and portions of the top surface which are overlaid by remaining portions of the first resist layer are not substantially etched. Another application are selective lift-off deposition processes in which, after patterning of both layers of the resist, a thin film of a predetermined material is deposited overall followed by removal of the remaining portions of the resist layers, whereby the predetermined material remains on portions of the top surface of the base which had been exposed by the developed first resist layer in the predetermined pattern and does not substantially remain on other portions of the top surface. Another application is ion implantation processes in which after development of both resist layers a desired dose of at least on predetermined ion species is implanted on the body or base, whereby the desired dose is at least partially stopped by remaining portions of the resist materials to provide patterned ion implantation. Yet another application is in metallization processes. In such a process before forming layers of first and second resists, contact holes are etched in predetermined locations on the integrated circuit structure, and a thin film of a metal is deposited overall on top of the top surface of the base or structure. Next, the first and second resist layers are formed, exposed and developed. Finally, the structure is exposed to a predetermined metal etchant plasma, whereby portions of the metal film exposed by the first resist layer are etched and portions of the metal film which are overlaid by remaining portions of the first resist layer are not substantially etched.

While the invention has been described with respect to preferred embodiments, it is to be understood that the invention is capable of numerous modifications, rearrangement and changes that are within the scope of the invention as defined by the appended claims.

TECHNICAL ADVANTAGES OF THE INVENTION

The present invention advantageously provides a method for improved pattern resolution in a bilayer resist process for integrated circuit patterning.

The present invention advantageously provides a system for utilizing relatively inexpensive near UV or violet light sources for the flood illumination of planarization layer photoresist in a bilayer resist process.

The present invention advantageously provides a system for improved speed in the flood illumination of flood exposure of the planarization layer of photoresist in a bilayer resist process.

The present invention advantageously provides a system for reduced resist patterning inaccuracy due to reflections from lower layer structures in a bilayer resist process.

The present invention advantageously provides a system having a patterned resist structure of improved dry etch resistance.

What is claimed is:

1. A method of patterning photoresist on a body having semiconducting surface areas comprising:
    forming on said body a first layer of photoresist material, said photoresist material of said first layer being sensitive to a first predetermined spectrum of light;
    forming a second layer of photoresist material on said first layer, said photoresist material of said second layer being sensitive to a second predetermined spectrum of light and opaque to said first predetermined spectrum of light, wherein said first predetermined spectrum is of a wavelength longer than said second predetermined spectrum;
    exposing a selected portion of said second layer to light of said second predetermined spectrum;
    removing the exposed portion of said second layer; and
    exposing said first layer covered by the remaining portion of said second layer to a blanket exposure of light of said first predetermined spectrum.

2. The method of claim 1, wherein said second predetermined spectrum is of a wavelength less than 310 nanometers.

3. The method of claim 2, wherein said first predetermined spectrum is of a wavelength greater than 310 nanometers.

4. The method of claim 3, where said patterning of said second layer is accomplished by exposure of light through a reticle.

5. The method of claim 3, wherein said exposure of said first layer by blanket exposure serves to transfer the pattern set in said second layer to said first layer.

6. The method of claim 3, wherein said first layer is formed to provide a substantially planar surface.

7. An integrated circuit patterning process comprising the steps of:
forming a body having semiconducting areas and also having a top surface;
forming a layer of a first photoresist material over said surface of said body;
providing an opaquing agent in a second photoresist material, said opaquing agent serving to render said second photoresist opaque to a first predetermined wavelength of light;
forming a layer of said second photoresist material with opaquing agent over said first photoresist material, said second photoresist material being sensitive to a second predetermined wavelength of light and said second predetermined wavelength being shorter than said first predetermined wavelength;
exposing said second photoresist material to pattered optical illumination of said second predetermined wavelength in a predetermined pattern;
developing said second photoresist material so that said second photoresist material is removed in areas determined by said predetermined pattern;
illuminating said first photoresist material at said first predetermined wavelength; and
developing said first photoresist.

8. The process of claim 7, wherein, said second predetermined wavelength is less than 310 nanometers.

9. The process of claim 7, wherein said first predetermined wavelength is above 310 nanometers.

10. The process of claim 8, wherein said first predetermined wavelength is above 310 nanometers.

11. The process of claim 7, wherein said first photoresist material is formed in a layer over said top surface, said layer of first photoresist having a thickness of from 0.6 to 1.9 microns.

12. The process of claim 11, wherein said second photoresist material is formed in a layer over said first photoresist material, said layer of second photoresist material having a thickness of less than 1.0 micron.

13. The process of claim 8, wherein said first predetermined wavelength is above 350 nanometers.

14. The process of claim 13, wherein said first and second photoresist materials have compositions such that said second photoresist material can be developed in a solvent which will not erode said first photoresist material.

15. The process of claim 8, wherein said opaquing agent comprises Coumarin No. 6 dye.

16. An integrated circuit patterning process for a body having semiconducting areas and also having a top surface comprising:
forming a first photoresist material over said top surface of said body, said first photoresist material being deposited to provide a substantially planar surface, and said first photoresist material being sensitive to a first predetermined wavelength of light;
forming a second photoresist material over said first photoresist material, said second photoresist material being sensitive to light of a second predetermined wavelength which second predetermined wavelength is shorter than said first predetermined wavelength;
exposing said second photoresist material to patterned optical illumination at said second predetermined wavelength in a predetermined pattern;
developing said second photoresist material so that said second photoresist material is removed in areas determined by said predetermined pattern;
illuminating said first photoresist material with light of said first predetermined wavelength with said second photoresist being opaque to said first predetermined wavelength of light during said illuminating of said first photoresist material; and
developing said first photoresist.

17. The process of claim 16, wherein said second photoresist material is rendered opaque by the inclusion therein of an opaquing agent.

18. The process of claim 16, wherein said second predetermined wavelength is less than 310 nanometers.

19. The process of claim 18, wherein said first, predetermined wavelength is greater than 310 nanomters.

20. The process of claim 19, wherein said first photoresist material is deposited in a layer over said top surface, said layer of first photoresist having a thickness of from 0.6 to 1.9 microns.

21. The process of claim 20, wherein said second photoresist material is deposited is a layer over said first photoresist material, said layer of second photoresist material having a thickness of less than 1.0 micron.

22. The process of claim 18, wherein said first predetermined wavelength of light is above 350 nanometers.

23. The process of claim 17, further comprising:
exposing said body to a predetermined etchant, whereby portions of said top surface exposed by said first photoresist layer are etched and portions of said top surface which are overlaid by remaining portions of said first photoresist layer are not substantially etched.

24. The process of claim 23, wherein said first photoresist material is resistant to said predetermined etchant.

25. The process of claim 23, wherein said second photoresist material is resistant to said predetermined etchant.

26. The process of claim 23, wherein said first and second photoresist materials have respective compositions such that said second photoresist material can be developed in a solvent which will not erode said first photoresist material.

27. The process of claim 17, further comprising:
depositing a thin film of a predetermined material overall; and
removing the remaining portions of said photoresist layers, whereby said predetermined material remains on portions of said top surface which had been exposed by said developed first photoresist layer in said predetermined pattern and does not substantially remain on other portions of said top surface.

28. The process of claim 22, further comprising:
depositing a thin film of a predetermined material overall; and
removing the remaining portions of said photoresist layers, whereby said predetermined material remains on portions of said top surface which had been exposed by said developed first photoresist layer in said predetermined pattern and does not substantially remain on other portions of said top surface.

29. The of claim 17, further comprising:
implanting said body a desired dose of at least one predetermined ion species at a predetermined energy, whereby said desired dose is at least partially stopped by remaining portions of said photoresist materials to provide patterned ion implantation.

30. The process of claim 22, further comprising:
implanting said body a desired dose of at least one predetermined ion species at a predetermined energy, whereby said desired dose is at least partially stopped by remaining portions of said photoresist materials to provide patterned ion implantation.

31. The process of claim 17, further comprising:
etching, prior to forming said first photoresist material over said top surface, contact holes in predetermined locations and depositing a thin film of a metal overall on said surface;

exposing, after developing said first photoresist, said integrated circuit structure to a predetermined metal etchant plasma, whereby portions of said metal film exposed by said first photoresist layer are etched and portions of said metal film which are overlaid by remaining portions of said first photoresist layer are not substantially etched.

32. The process of claim 22, further comprising:
etching, prior to forming said first photoresist material over said top surface, contact holes in predetermined locations and depositing a thin film of a metal overall on said top surface;

exposing, after developing said first photoresist, said integrated circuit structure to a predetermined metal etchant plasma, whereby portions of said metal film exposed by said first photoresist layer are etched and portions of said metal film which are overlaid by remaining portions of said first photoresist layer are not substantially etched.

33. The process of claim 22, further comprising:
exposing said body to a predetermined etchant, whereby portions of said top surface exposed by said first photoresist layer are etched and portions of said top surface which are overlaid by remaining portions of said first photoresist layer are not substantially etched.

* * * * *